(12) United States Patent
Kaeding et al.

(10) Patent No.: US 11,018,098 B2
(45) Date of Patent: May 25, 2021

(54) FABRICATED TWO-SIDED MILLIMETER WAVE ANTENNA USING THROUGH-SILICON-VIAS

(71) Applicant: Micron Technology, Inc., Boise, ID (US)

(72) Inventors: John F. Kaeding, Boise, ID (US); Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/118,723

(22) Filed: Aug. 31, 2018

(65) Prior Publication Data

US 2020/0075512 A1 Mar. 5, 2020

(51) Int. Cl.
| | |
|---|---|
| *H01L 23/48* | (2006.01) |
| *H01L 29/40* | (2006.01) |
| *H01L 23/52* | (2006.01) |
| *H01L 23/66* | (2006.01) |
| *H01Q 1/22* | (2006.01) |
| *H01L 23/00* | (2006.01) |
| *H01L 27/108* | (2006.01) |
| *H01L 25/065* | (2006.01) |
| *H01L 23/538* | (2006.01) |

(52) U.S. Cl.
CPC .......... *H01L 23/66* (2013.01); *H01L 23/5384* (2013.01); *H01L 24/09* (2013.01); *H01L 25/0657* (2013.01); *H01L 27/108* (2013.01); *H01Q 1/2283* (2013.01); *H01L 2223/6677* (2013.01); *H01L 2224/02331* (2013.01); *H01L 2224/02372* (2013.01)

(58) Field of Classification Search
CPC ....... H01L 23/5226; H01L 2224/08046; H01L 2223/6677; H01L 21/76897; H01L 23/49827; H01L 21/486
USPC .................................................. 257/758, 750
See application file for complete search history.

(56) References Cited

U.S. PATENT DOCUMENTS

| | | | | |
|---|---|---|---|---|
| 8,648,454 B2 * | 2/2014 | Liu | ......................... | H01L 23/66 |
| | | | | 257/684 |
| 9,799,630 B2 * | 10/2017 | Pagani | .................... | H01L 23/48 |
| 2010/0164671 A1 * | 7/2010 | Pagani | .................... | H01L 23/48 |
| | | | | 336/200 |
| 2017/0245035 A1 * | 8/2017 | Lee | ......................... | H01L 24/32 |

* cited by examiner

*Primary Examiner* — S. V. Clark
(74) *Attorney, Agent, or Firm* — Perkins Coie LLP

(57) ABSTRACT

A system may include a first semiconductor substrate having a first side and a second side opposite the first side. The system may further include multiple device layers positioned on the first side of the substrate. The system may also include a first portion of an antenna structure positioned within at least one of the multiple device layers. The system may include a second portion of the antenna structure positioned over the second side of the substrate. The system may further include a via passing through the substrate and electrically coupling the first portion of the antenna structure to the second portion of the antenna structure.

19 Claims, 7 Drawing Sheets

FABRICATED TWO-SIDED MILLIMETER WAVE ANTENNA USING THROUGH-SILICON-VIAS

FIELD

The embodiments described herein relate to fabricated two-sided millimeter wave antenna using through-silicon-vias.

BACKGROUND

As computing devices become more integrated into society, data access and mobility is becoming more important to a typical consumer. Compact wireless computing devices, such as cell phones, tablets, laptops, etc., are becoming faster, smaller, and more mobile. In order to meet the demands of new generation products, processing and memory packages within mobile devices must become faster and more compact. 5th Generation Wireless Systems (5G) provide high throughput, low latency, high mobility, and high connection density. Making use of millimeter wave bands (24-86 GHz) for mobile data communication is beneficial for producing 5G systems.

Antennas used for millimeter wave communication typically include an antenna array deposited on a printed circuit board (PCB) within a mobile device. The area, or real estate, occupied by the antennas may decrease the density of devices attached to the PCB and may result in larger, less mobile devices. By including the antenna within a device layer of an integrated circuit, space may be saved on the PCB. However, the device layer may not include enough space for a complete antenna usable for millimeter wave communication. Other disadvantages may exist.

Figure 1:
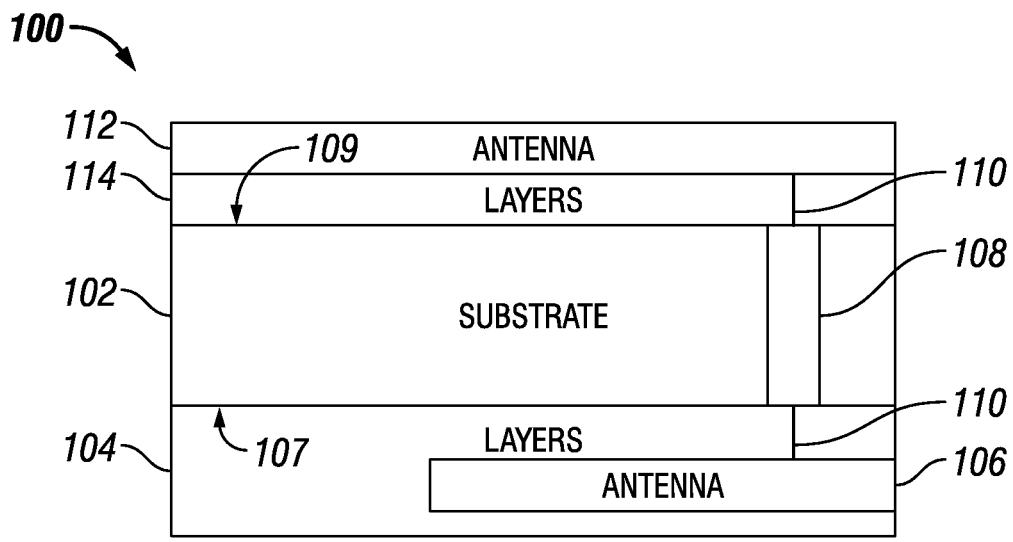
FIG. 1 is schematic diagram depicting an embodiment of a semiconductor system, which may correspond to a semiconductor device.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure a system includes a first semiconductor substrate having a first side and a second side opposite the first side. The system further includes multiple device layers positioned on the first side of the substrate. The system also includes a first portion of an antenna structure positioned within at least one of the multiple device layers. The system includes a second portion of the antenna structure positioned over the second side of the substrate. The system further includes a via passing through the substrate and electrically coupling the first portion of the antenna structure to the second portion of the antenna structure.

In another embodiment, a system includes a first semiconductor device having a first side and a second side opposite the first side. The system further includes a mold compound region adjacent to the semiconductor device. The system also includes a redistribution layer positioned on the first side of the semiconductor device. The system includes a first portion of an antenna structure formed within the redistribution layer. The system further includes a second portion of the antenna structure positioned over the second side of the first semiconductor device. The system also includes a via passing through the mold compound region and electrically coupling the first portion of the antenna structure to the second portion of the antenna structure.

Referring to FIG. 1, a semiconductor system 100 is depicted. As depicted in FIG. 1, the system 100 may correspond to a semiconductor device. The system 100 may include a semiconductor substrate 102 and one or more device layers 104. The device layers 104 may interact with the semiconductor substrate 102 to perform various electronic functions. For example, the device layers 104 and the substrate 102 may form processing elements, memory elements, and/or other types of electrical elements. The semiconductor substrate 102 may be a silicon substrate or another type of semiconductor material.

The device layers 104 may include at least one layer, or a portion of a layer, that defines a first portion 106 of an antenna structure. For example, the device layer 104 may include multiple metal layers (e.g., M1-M8), where one of the metal layers (e.g., M5) may be dedicated, or partially dedicated, to defining the first portion 106 of the antenna structure. As such, the first portion 106 of the antenna structure may be integrated within the device layers 104 on a first side 107 of the semiconductor substrate 102. The first side 107 may correspond to an active side or device side.

A second portion 112 of the antenna structure may be positioned over a second side 109 of the semiconductor substrate 102. The second side 109 may include additional space to meet area requirements that may be associated with a particular antenna. Together, the first portion 106 and the second portion 112 may define a millimeter wave antenna for use with 5th Generation cellular data systems.

The semiconductor substrate 102 may include a via 108 passing therethrough. The via 108 may be a through-silicon-via and may electrically couple the first portion 106 of the antenna structure with the second portion 112 of the antenna structure. In some embodiments, additional layers 114, such as radio frequency shielding, insulator barriers, etc., may be positioned between the second portion 112 of the antenna structure and the semiconductor substrate 102. Electrical connections 110 may provide conductive paths through the device layers 104 and the additional layers 114 in order to electrically couple the first portion 106 and the second portion 112 of the antenna structure.

During operation, devices formed by the semiconductor substrate 102 and the device layers 104 may include radio circuitry, such as a transmitter, receiver, or transceiver. The radio circuitry may be communicatively coupled with the first portion 106 of the antenna. Together, the second portion 112 and the first portion 106 may transmit and receive airborne radio signals, which can be generated and/or processed by the radio circuitry.

An advantage of the system 100 is that by including antenna circuitry within both the device layers 104 on the first side 107 of the semiconductor substrate 102 and over the second side 109 of the semiconductor substrate, a sufficient area may be dedicated to a complete antenna to enable millimeter wave transmissions. This is particularly beneficial if a layer that includes the first portion 106 of the antenna structure does not, on its own, have enough area available to define a complete millimeter wave antenna. Other advantages may exist.

Figure 2:
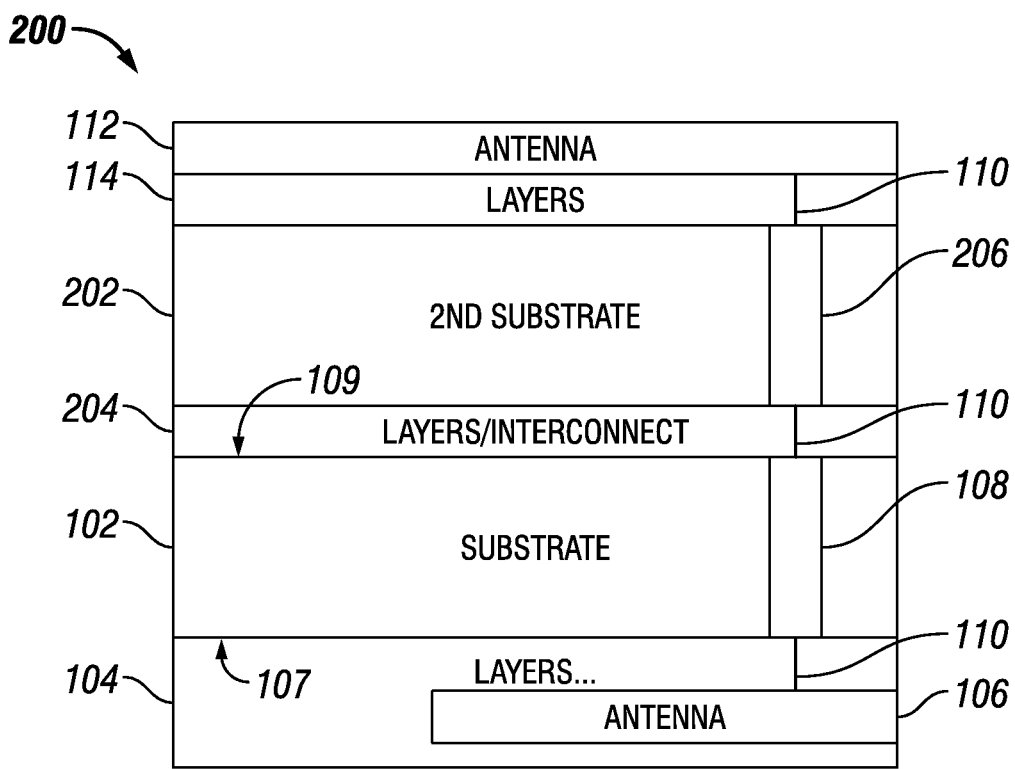
FIG. 2 is a schematic diagram depicting an embodiment of a semiconductor system, which may correspond to a semiconductor device assembly.

Referring to FIG. 2, a semiconductor system 200 is depicted. The system 200 may correspond to a semiconductor device assembly and may include multiple semiconductor devices. For example, the system 200 may include a semiconductor substrate 102 having a first side 107 (e.g., an active side) and a second side 109, opposite the first side 107. The system 200 may further include one or more device layers 104 positioned on the first side 107 of the substrate 102.

A first portion 106 of an antenna structure may be positioned within the device layers 104. A second portion 112 of the antenna structure may be positioned over the second side 109 of the semiconductor substrate 102. As used herein, "positioned over" means that the second portion 112 is positioned on an opposite side of the substrate 102 than the first portion 106 of the antenna structure, and may have multiple layers, substrates, or devices positioned between the second portion 112 of the antenna structure and the substrate 102.

The system 200 may include a second substrate 202. The second substrate 202 may include intermediate layers 204 such as additional device layers and/or interconnects. For example, the second substrate 202 and the intermediate layers 204 may correspond to a second semiconductor device that may be coupled to the substrate 102 in a stacked chip configuration. In an embodiment, the substrate 102 and the device layers 104 may correspond to an application processor or another type of processing architecture. The second substrate 202 and intermediate layers 204 may correspond to a memory device, such as a dynamic random access memory array. The system 200 may also include additional layers 114 separating the second portion 112 of the antenna structure from the second substrate 202. However, in some embodiments, the additional layers 114 may be omitted and the second portion 112 of the antenna structure may be deposited directly on the second substrate 202.

The first portion 106 of the antenna structure and the second portion 112 of the antenna structure may be electrically coupled by a via 108 passing through the substrate 102 and by a second via 206 passing through the second substrate 202. Various electrical connections 110 may be present to complete the electrical connection between the first portion 106 and the second portion 112.

An advantage of the system 200 is that by including antenna circuitry within both the device layers 104 on the first side 107 of the semiconductor substrate 102 and over the second side 109 of the semiconductor substrate, a sufficient area may be dedicated to a complete antenna to enable millimeter wave transmissions. Further, a second substrate 202 may be positioned between the first portion 106 and the second portion 112, which may increase the functionality of the system 200 without reducing the effectiveness of the antenna structure. Other advantages may exist.

Figure 3:
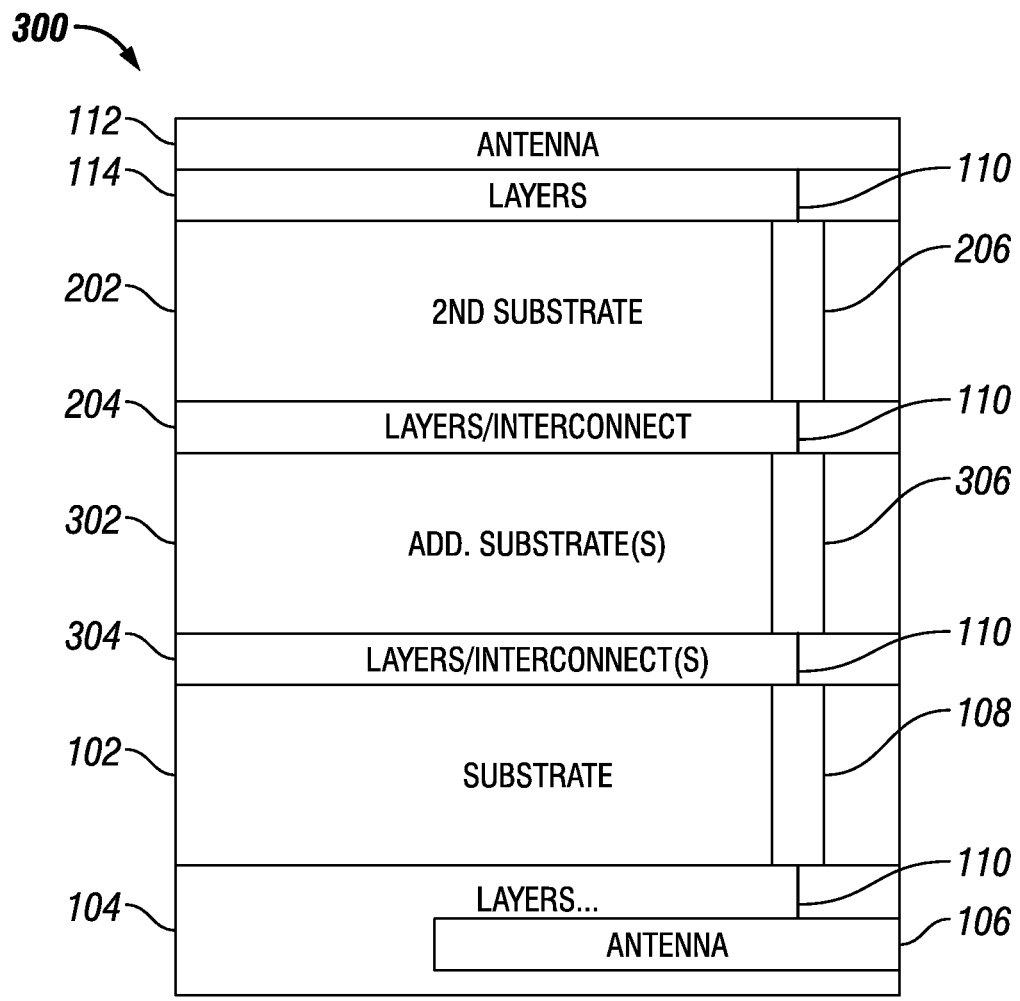
FIG. 3 is a schematic diagram depicting an embodiment of a semiconductor system, which may correspond to a semiconductor device assembly.

Referring to FIG. 3, a semiconductor system 300 is depicted. The system 300 may correspond to a semiconductor device assembly and may include multiple semiconductor devices. Similar to the system 200, the system 300 may include a first substrate 102 and a second substrate 202, with device layers 104 including a first portion 106 of an antenna structure formed on the substrate 102. The system 200 may include a second portion 112 of the antenna structure formed over the substrate 102. The first portion 106 and the second portion 112 may be electrically coupled by vias 108, 206 passing through the substrate 102 and the second substrate 202, respectively.

In addition to the substrate 102 and the second substrate 202, the system 300 may include any number of additional substrates 302 having additional intermediate layers 304. Each of the additional substrates 302 may have additional vias 306 passing therethrough. The vias 108, 206 and the additional vias 306 may electrically couple the first portion 106 to the second portion 112. Further, additional electrical connections 110 may complete the connection through the device layers 104, the intermediate layers 204, the additional intermediate layers 304, and any additional layers 114, if present.

FIG. 3 demonstrates that the system 300 may include any number of stacked semiconductor devices between the first portion 106 and the second portion 112 of the antenna structure. The system 300 may be implemented, for example, in three-dimensional stacked integrated circuits, and may be usable for millimeter wave communication and 5G communications.

Figure 4:
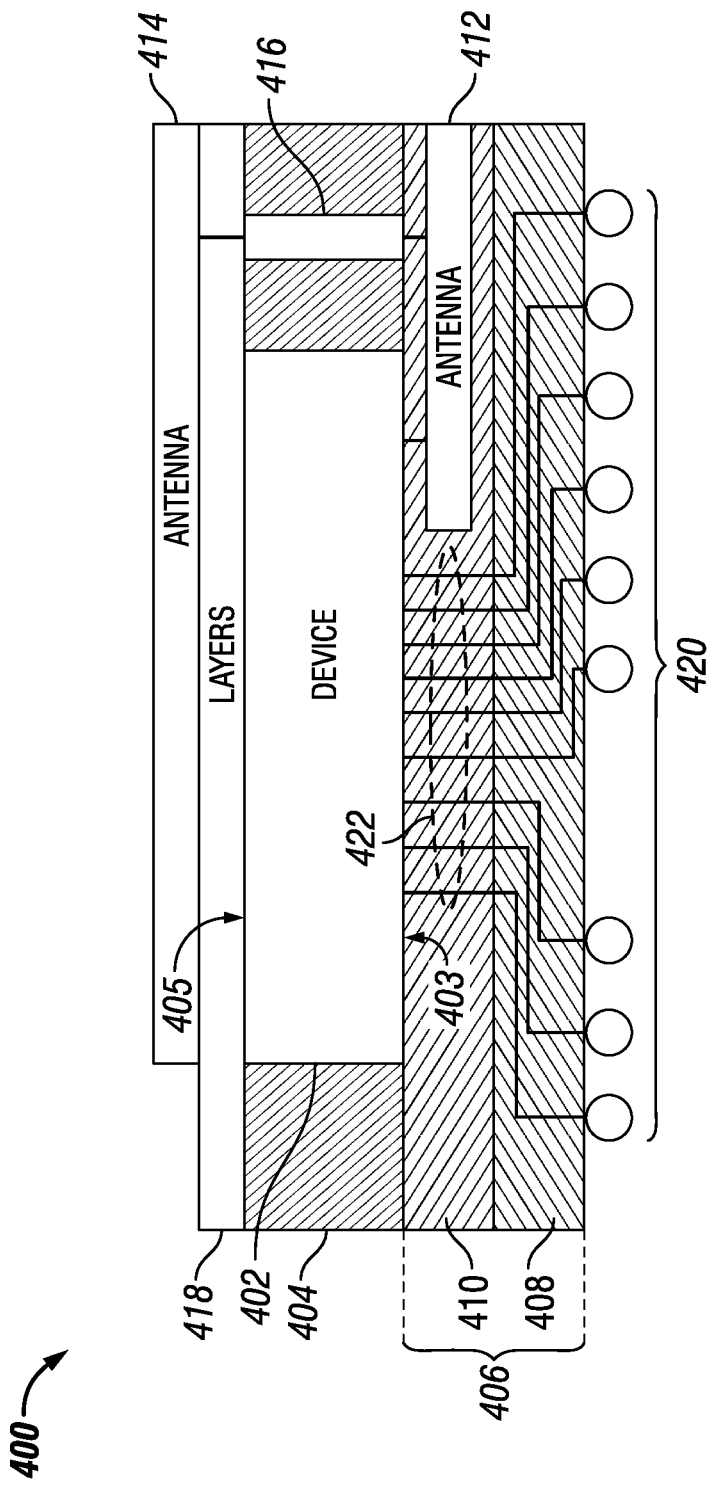
FIG. 4 is a schematic diagram depicting an embodiment of a semiconductor system, which may correspond to a semiconductor package.

Referring to FIG. 4, a semiconductor system 400 is depicted. The system 400 may correspond to a semiconductor package. The system 400 may include a semiconductor device 402 having a first side 403 and a second side 405. The semiconductor device 402 may be packaged within a mold compound 404, positioned adjacent to the semiconductor device 402.

A redistribution layer 406 may be positioned on the first side 403 of the semiconductor device 402. The redistribution layer 406 may include a first sublayer 408 and a second sublayer 410. The first sublayer 408 may be configured to route a set of connections 422 from the semiconductor 402 device to a surface mount coupling structure 420. In an embodiment, the surface mount coupling structure may include a ball grid array. The second sublayer 410 may define a first portion 412 of an antenna structure formed therein.

A second portion 414 of the antenna structure may be formed over the second side 405 of the semiconductor device 402. One or more intervening layers 418 may optionally be positioned between the mold compound 404 and/or the semiconductor device 402 and the second portion 414 of the antenna structure. For example, the one or more intervening layers 418 may include additional mold compound, radio frequency shielding, insulator barriers, etc. A via 416 may pass through the mold compound and may electrically couple the first portion 412 of the antenna structure with the second portion 414 of the antenna structure.

An advantage of the system 400 is that by including antenna circuitry within both the redistribution layer 406 on the first side 403 of the semiconductor device 402 and over the second side 405 of the semiconductor device 402, a sufficient area may be dedicated to a complete antenna to enable millimeter wave transmissions. Other advantages may exist.

Figure 5:
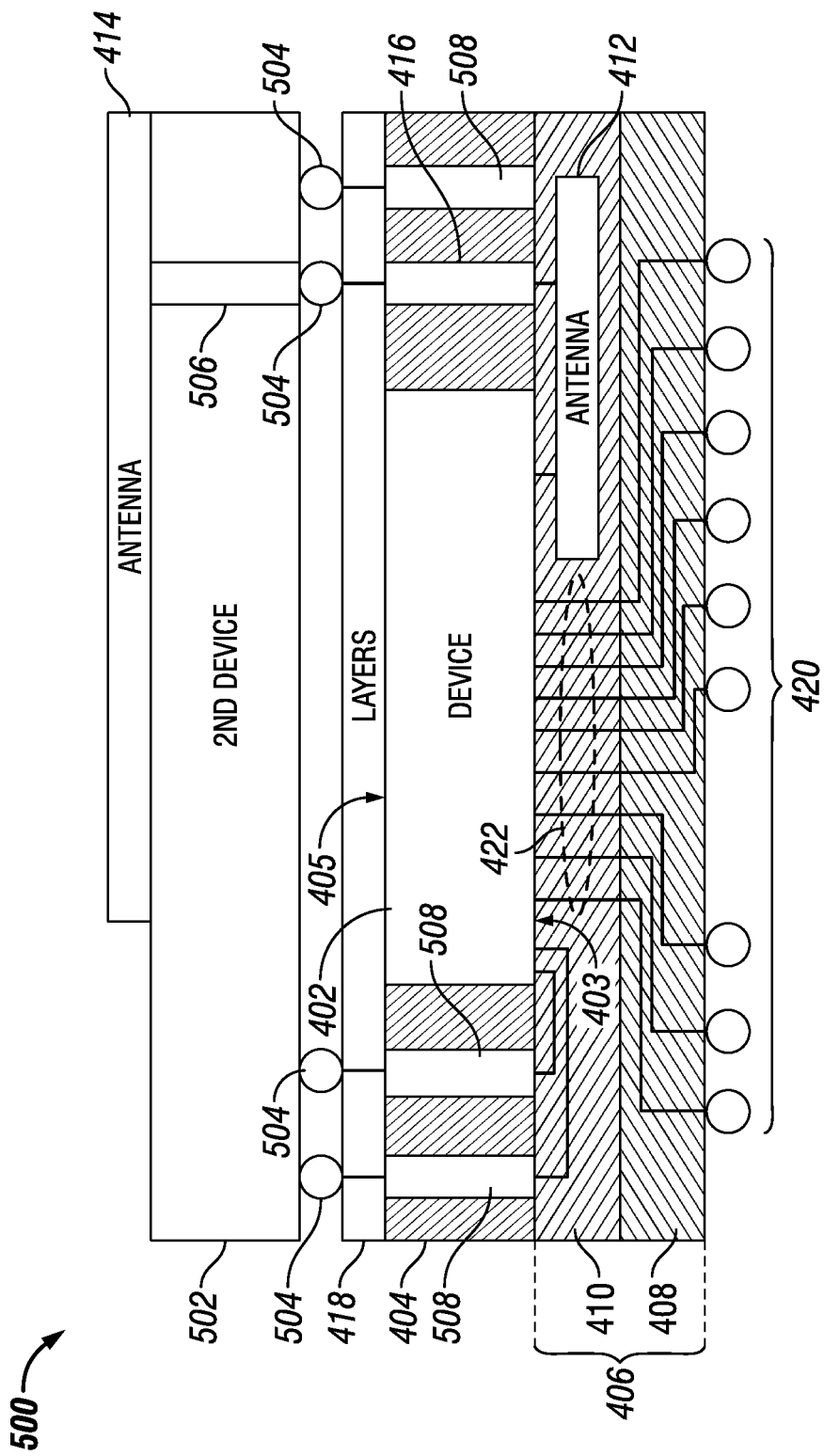
FIG. 5 is a schematic diagram depicting an embodiment of a semiconductor system, which may correspond to stacked semiconductor packages.

Referring to FIG. 5, a semiconductor system 500 is depicted. The semiconductor system 500 may correspond to stacked semiconductor packages. The system 500 may include a semiconductor device 402 having a first side 403 and a second side 405. The system 500 may further include a mold compound 404 adjacent to the semiconductor device 402. A redistribution layer 406 may perform routing to couple a set of connections 422 from the semiconductor device 402 to a surface mount coupling structure 420.

The redistribution layer 406 may include a first sublayer 408 and a second sublayer 410. A first portion 412 of an antenna structure may be formed within the second sublayer 410. A second portion 414 of the antenna structure may be formed on a second semiconductor device 502 and may be positioned over the second side 405 of the semiconductor device 402. The second semiconductor device 502 may correspond to a packaged device and may be coupled to the semiconductor device 402 in a package-on-package configuration. A stack interconnect structure 504 may electrically couple the second semiconductor device 502 to the semiconductor device 402 through a set of vias 508 and through the mold compound 404.

A via 416 through the mold compound 404 and a via 506 through the second semiconductor device 502 may electrically couple the first portion 412 of the antenna structure with the second portion 414 of the antenna structure. The system 500 may further include one or more intervening layers 418 between the mold compound 404 and/or semiconductor device 402 and the second semiconductor device 502.

An advantage of the system 500 is that by including antenna circuitry within both the redistribution layer 406 and on the second semiconductor device 502, a sufficient area may be dedicated to a complete antenna to enable millimeter wave transmissions. Further, the antenna structure may span semiconductor packages. Other advantages may exist.

Figure 6:
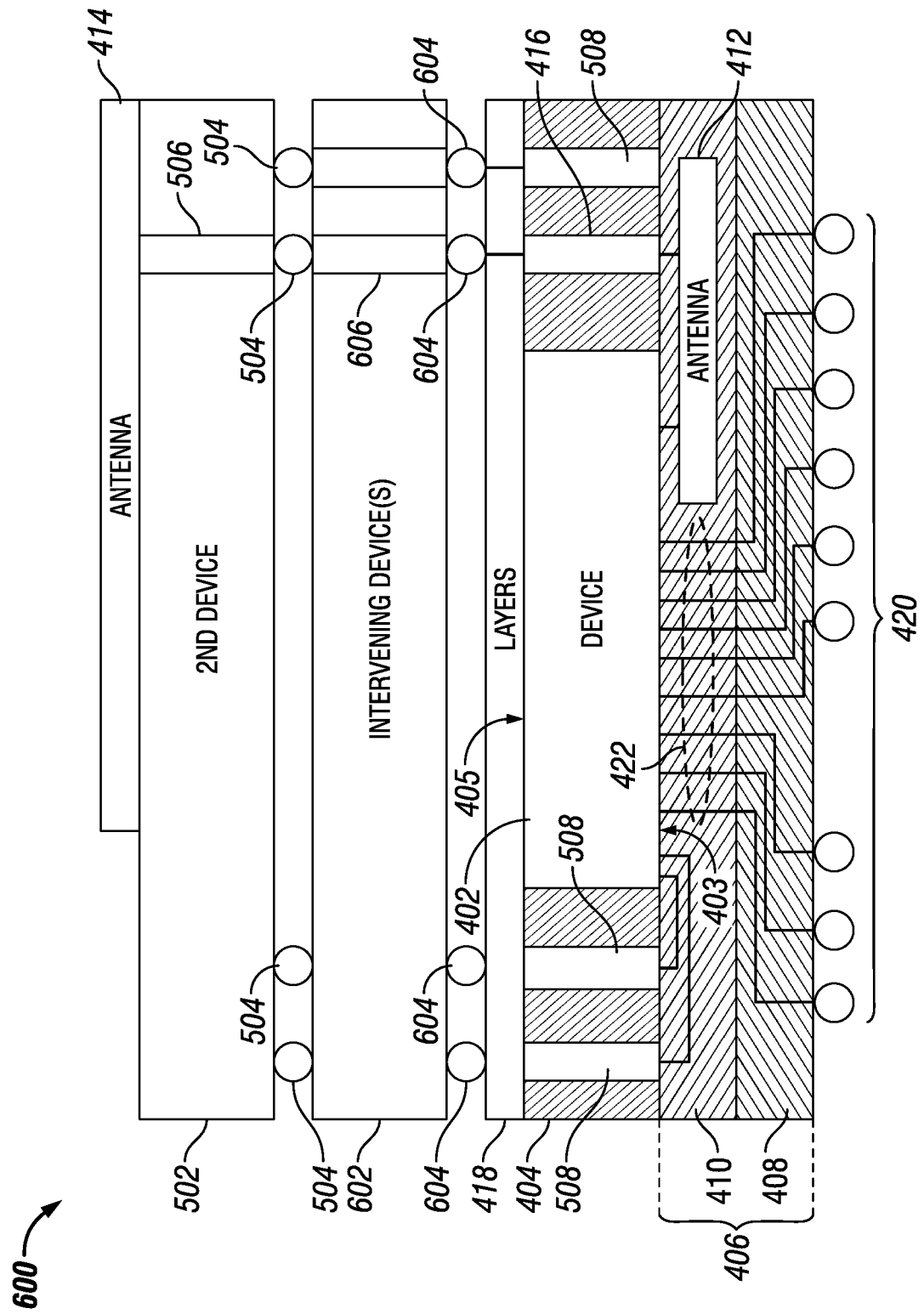
FIG. 6 is a schematic diagram depicting an embodiment of a semiconductor system, which may correspond to stacked semiconductor packages.

Referring to FIG. 6, a semiconductor system 600 is depicted. The semiconductor system 600 may correspond to multiple stacked semiconductor packages. The system 600 may include a semiconductor device 402 having a first side 403 and a second side 405. The system 600 may further include a mold compound 404 adjacent to the semiconductor device 402. A redistribution layer 406 may perform routing to couple a set of connections 422 from the semiconductor device 402 to a surface mount coupling structure 420.

The redistribution layer 406 may include a first sublayer 408 and a second sublayer 410. A first portion 412 of an antenna structure may be formed within the second sublayer 410. A second portion 414 of the antenna structure may be formed on a second semiconductor device 502 and may be positioned over the second side 405 of the semiconductor device 402. The system 600 may further include one or more intervening semiconductor devices 602. The second semiconductor device 502 and the intervening semiconductor device 602 may correspond to packaged devices and may be coupled to the semiconductor device 402 in a package-on-package configuration. A stack interconnect structure 504 may electrically couple the second semiconductor device 502 to intervening semiconductor device 602 and a corresponding intervening stack interconnect structure 604 may couple the intervening semiconductor device 602 to the semiconductor device 402. Connections between the semiconductor device 402 may be made with the intervening semiconductor device 602 through a set of vias 508 in the mold compound 404 and through the redistribution layer 406. Although not depicted in FIG. 6, additional connections may be made between the intervening semiconductor device 602 and the second semiconductor device 502.

A via 416 through the mold compound 404, a via 506 through the second semiconductor device 502, and a via 606 through the intervening semiconductor device 602 may electrically couple the first portion 412 of the antenna structure with the second portion 414 of the antenna structure. The system 500 may also include one or more intervening layers 418 between the mold compound 404 and/or the semiconductor device 402 and the intervening semiconductor device 602. Although, not depicted in FIG. 6, the system 600 may include multiple intervening devices 602 as may be desirable for a particular application.

FIG. 6 demonstrates that the system 600 may include any number of stacked semiconductor devices between the first portion 412 and the second portion 414 of the antenna structure. The system 600 may be implemented, for example, in three-dimensional stacked integrated circuits and/or package on package configurations, and may also be usable for millimeter wave communication and 5G communications.

Figure 7:
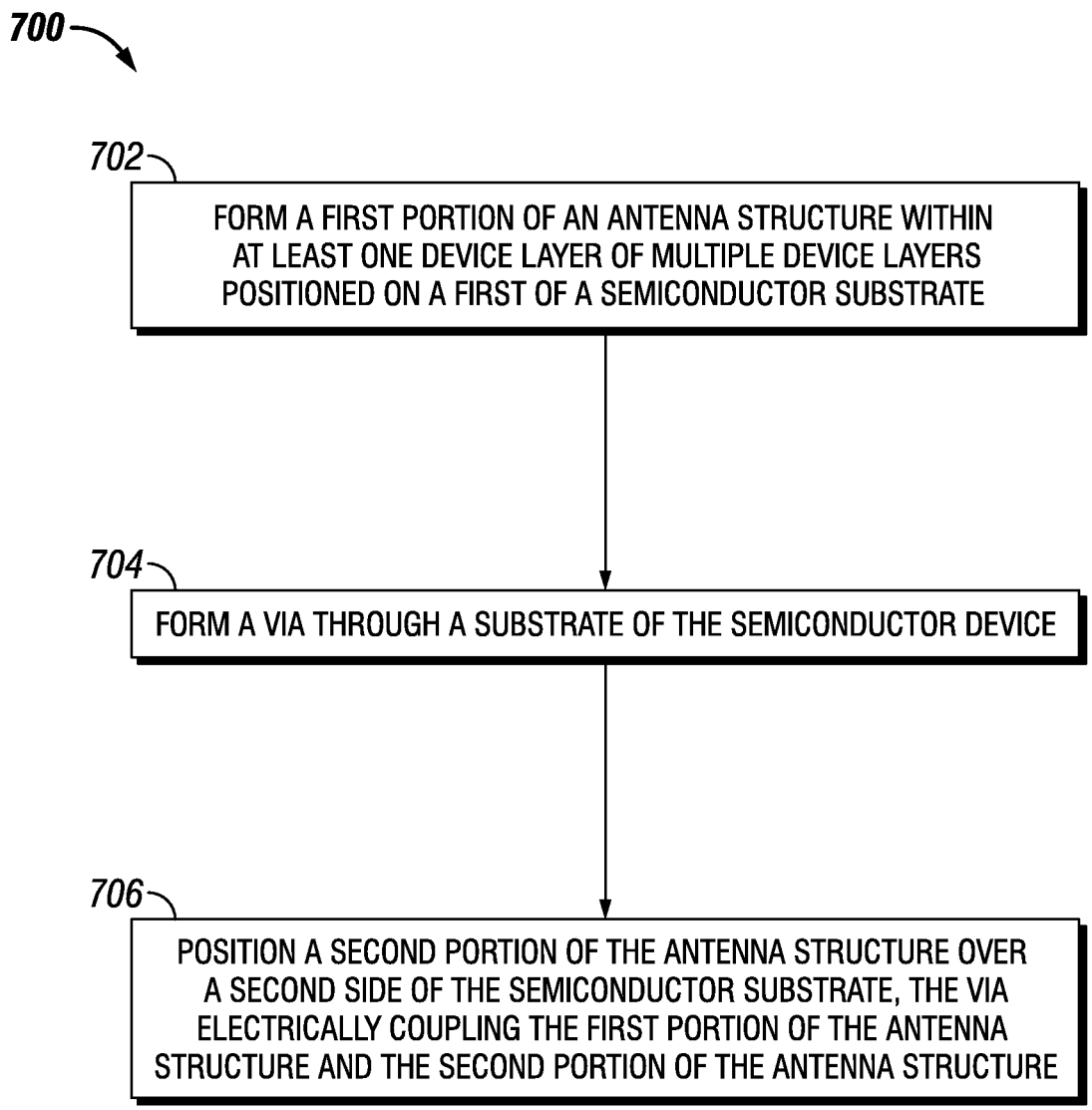
FIG. 7 is flow diagram depicting an embodiment of a method for forming a two-sided millimeter wave antenna.

FIG. 7 depicts a method 700 for forming a two-sided millimeter wave antenna. The method 700 may include forming a first portion of an antenna structure within at least one device layer of multiple device layers positioned on a first side of a semiconductor substrate, at 702. For example, the first portion 106 of the antenna structure of FIG. 1 may be formed within the device layers 104 positioned on the first side 107 of the semiconductor substrate 102.

The method 700 may further include forming a via through a substrate of the semiconductor device, at 704. For example, the via 108 may be formed through the substrate 102.

The method 700 may also include positioning a second portion of the antenna structure over a second side of the semiconductor substrate, the via electrically coupling the first portion of the antenna structure and the second portion of the antenna structure, at 706. For example, the second portion 112 of the antenna structure may be positioned over the second side 109 of the semiconductor substrate 102.

An advantage of the method 700 is that a semiconductor system, e.g., an integrated circuit device, may be formed with an antenna that has sufficient area for millimeter wave communication, even when the amount of area within the device layers 104 is limited. Other advantages may exist.

Figure 8:
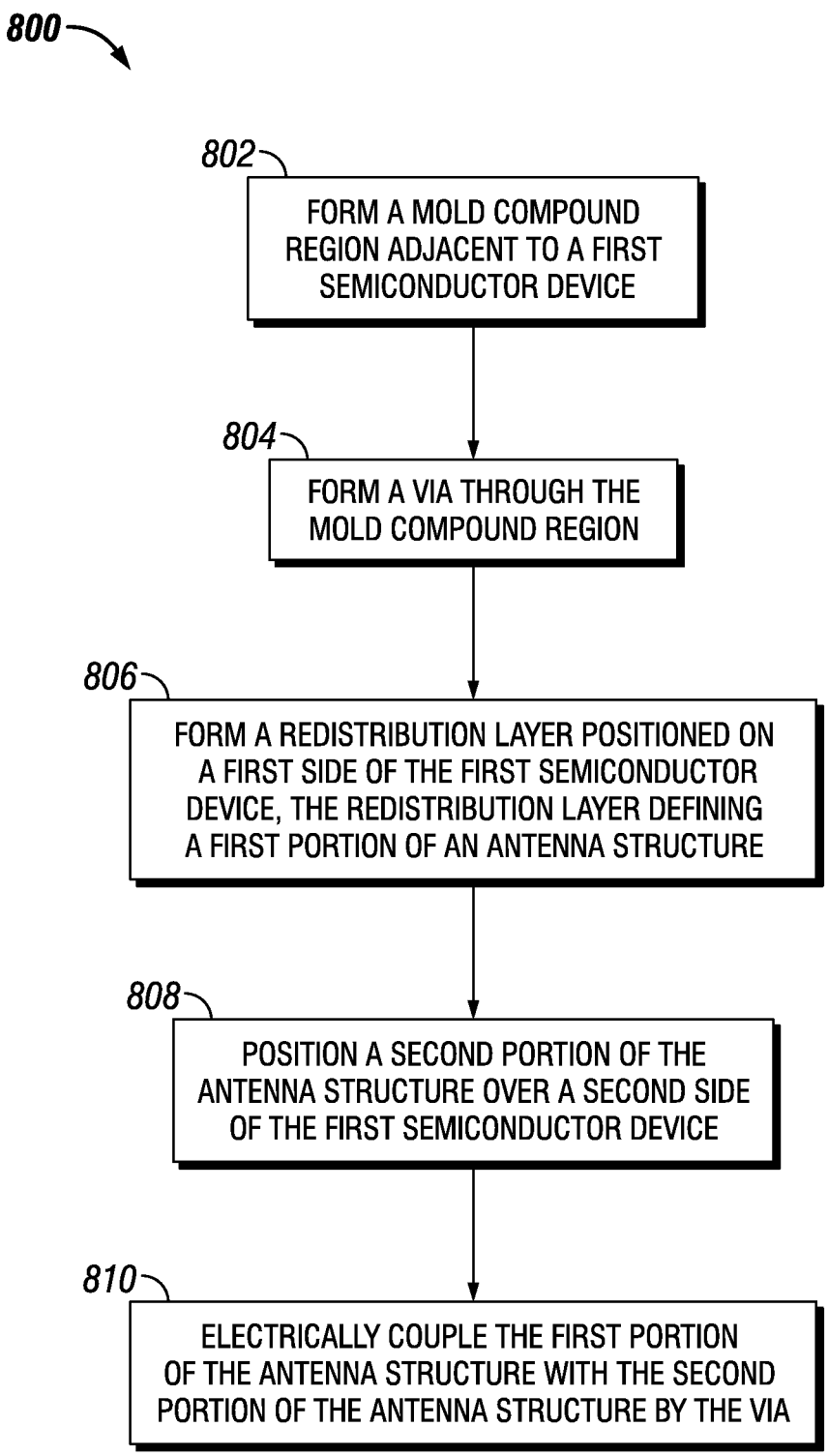
FIG. 8 is flow diagram depicting an embodiment of a method for forming a two-sided millimeter wave antenna.

FIG. 8 depicts a method 800 for forming a two-sided millimeter wave antenna. The method 800 may include forming a mold compound region adjacent to a first semiconductor device, at 802. For example, the mold compound 404 may be formed adjacent to the semiconductor device 402.

The method 800 may further include forming a via through the mold compound region, at 804. For example, the via 416 may be formed through the mold compound 404.

The method 800 may also include forming a redistribution layer positioned on a first side of the first semiconductor device, the redistribution layer defining a first portion of an antenna structure, at 806. For example, the redistribution layer 406, including the first portion 412 of the antenna structure of FIG. 4, may be formed on the first side 403 of the semiconductor device 402.

The method 800 may include positioning a second portion of the antenna structure over a second side of the first semiconductor device, at 808. For example, the second portion 414 of the antenna structure may be formed over the second side 405 of the semiconductor device 402.

The method 800 may further include electrically coupling the first portion of the antenna structure with the second portion of the antenna structure by the via, at 810. For example, the first portion 412 and the second portion 414 may be electrically coupled by the via 416 through the mold compound 404.

An advantage of the method 800 is that a semiconductor system, e.g., a packaged integrated circuit device, may be formed with an antenna that has sufficient area for millimeter wave communication, even when the amount of area within the redistribution layer 406 is limited. Other advantages may exist.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A system comprising:
   a first semiconductor device having a first side and a second side opposite the first side;
   a mold compound region adjacent to the semiconductor device;
   a redistribution layer positioned on the first side of the semiconductor device;
   a first portion of an antenna structure formed within the redistribution layer;
   a second portion of the antenna structure positioned over the second side of the first semiconductor device; and
   a via passing through the mold compound region and electrically coupling the first portion of the antenna structure to the second portion of the antenna structure.

2. The system of claim 1, further comprising:
   one or more intervening layers between the second portion of the antenna and the mold compound region.

3. The system of claim 1, further comprising:
   a second semiconductor device stacked onto the first semiconductor device.

4. The system of claim 3, further comprising:
   one or more intervening semiconductor devices positioned between the first semiconductor device and the second semiconductor device.

5. The system of claim 1, wherein the redistribution layer includes a first sublayer and a second sublayer.

6. The system of claim 1, wherein the antenna structure is a millimeter wave antenna.

7. The system of claim 2, wherein the one or more intervening layers includes additional mold compound.

8. The system of claim 2, wherein the one or more intervening layers includes radio frequency shielding.

9. The system of claim 2, wherein the one or more intervening layers includes insulator barriers.

10. The system of claim 3, wherein the second portion of the antenna structure is positioned on the second semiconductor device.

11. The system of claim 3, wherein the second semiconductor device corresponds to a packaged device.

12. The system of claim 3, wherein the second semiconductor device is coupled to the first semiconductor device in a package-on-package configuration.

13. The system of claim 3, wherein a stack interconnect structure electrically couples the second semiconductor device to the first semiconductor device.

14. The system of claim 4, wherein the second semiconductor device and the intervening semiconductor devices are coupled to the first semiconductor device in a package-on-package configuration.

15. The system of claim 4, wherein each of the intervening semiconductor devices has a substrate and a via passing through the substrate.

16. The system of claim 15, wherein the first portion of the antenna structure is electrically coupled to the second portion of the antenna structure by the via.

17. The system of claim 5, wherein the first sublayer is configured to route a set of connections from the first semiconductor device to a surface mount coupling structure.

18. The system of claim 17, wherein the surface mount coupling structure includes a ball grid array.

19. The system of claim 5, wherein the second sublayer includes the first portion of the antenna.

* * * * *